Aug. 7, 1956 M. G. TEKOSKY 2,758,162

MAGNETIC AMPLIFIER

Filed March 2, 1951 2 Sheets-Sheet 1

INVENTOR
MORRIS G. TEKOSKY.
BY Chester Mueller
ATTORNEY

INVENTOR
MORRIS G. TEKOSKY
BY
[signature]
ATTORNEY

United States Patent Office 2,758,162

Patented Aug. 7, 1956

2,758,162

MAGNETIC AMPLIFIER

Morris G. Tekosky, Newark, N. J., assignor to Magnetics Incorporated, Bloomfield, N. J., a corporation of New Jersey Application March 2, 1951, Serial No. 213,617

6 Claims. (Cl. 179—171)

This invention relates to magnetic amplifiers, particularly of the transformer type. These amplifiers have many uses. In some applications they may used in place of vacuum tube amplifiers. They have other uses, however, where vacuum tube amplifiers are not so well suited because of the relatively high impedance of the input circuit for a vacuum tube. Magnetic amplifiers can be designed to have a very low impedance input circuit and at the same time to operate with a power gain factor of 1,000 and upwards.

The basic component of all magnetic amplifiers is a saturable reactor. Magnetic amplifiers as heretofore known have used such reactors in combination with rectifiers and other components such as auxiliary chokes, transformers and rheostats. I have found, however, that a saturable reactor may be so designed as to eliminate the need for much of the auxiliary equipment formerly thought to be indispensable. In this improved design I have developed a circuit arrangement and a saturable reactor which substantially constitutes a push-pull amplifier. It possesses all of the advantages of an electronic push-pull amplifier and other advantages as well.

It is an object of my invention to provide an improved magnetic amplifier of the push-pull type.

A second object is to provide a magnetic amplifier that requires no external chokes and transformers.

A third object is to provide a magnetic amplifier having a negative feedback characteristic which controls the gain throughout its useful control range and at the same time produces a substantially linear output corresponding to the value of the D. C. control potential. This is considered a great advantage over prior art devices which resort to self-saturation. The latter are not suitable for low energy level input circuits because they are subject to undesirable instability of operation.

A fourth object is to provide a magnetic amplifier having a positive feedback characteristic in which the gain is controlled throughout a desired range and produces a certain non-linear curve of output in relation to the input that satisfies the requirements of positive feedback devices without becoming unstable in operation as the gain approaches the high-level limit of the said range.

A fifth object is to provide a magnetic amplifier in which some or all of the foregoing objects are realized, the construction being such that it can be manufactured at relatively low cost; one of the methods of cost reduction being concerned with the cost of the core material to be used and with the process of winding the transformer coils for use in my improved magnetic amplifier.

A sixth object of my invention is to provide an improved combination of a biasing circuit with D. C. control circuit and a carrier input circuit such as to enable different components of a magnetic amplifier to be synchronized and to operate at maximum efficiency and with a high gain factor.

The foregoing and other objects and advantages of my invention will be more fully understood from the following detailed description and by reference to the accompanying drawings wherein.

Figure 1:
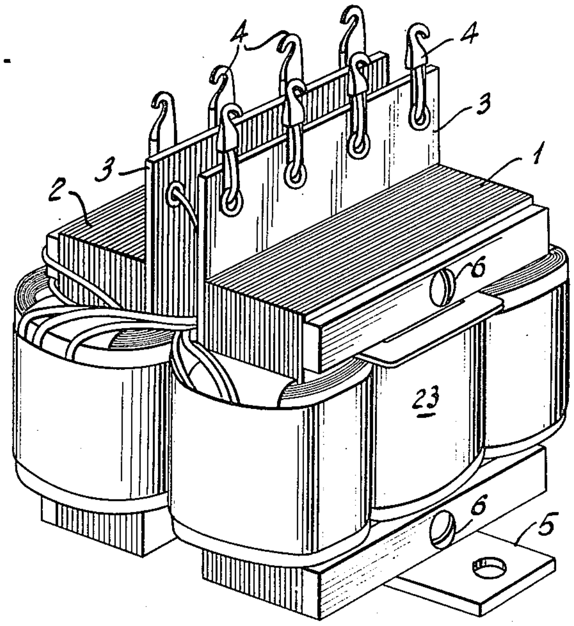
Figure 1 is a perspective view of a magnetic amplifier unit comprising a plurality of coils and magnetic core members which constitute a saturable modulator that is typical of my invention.

Referring first to Figure 1, I show therein two sets of core laminations 1 and 2 composed of magnetic material. Each layer of a three-leg lamination has two complementary sections, one with longer leg portions than the other. An upper section, if it has short legs, is mated with a lower section having long legs. Upper short-leg sections are alternated with upper long-leg sections and a similar alternation of lower sections is effected in order to minimize air gaps in the magnetic circuit.

In the past it has been found that a magnetic amplifier suffers a loss of sensitivity which is serious if the core of the saturable reactor has air-gaps of any appreciable proportions in the magnetic path of its core. So important did this matter seem to be that other workers in this field of endeavor have gone so fas as to construct reactors with ring-like cores that have no air-gaps whatsoever. That construction was very costly because the windings about such cores could only be made one at a time and by an operation which is very much slower than when coils are wound before assembling with laminated cores.

The type of push-pull amplifier herein shown and described as my invention is one that does not suffer loss of sensitivity to any serious extent when air gaps between mated laminations of the core are allowed to remain in the magnetic circuit.

Figure 2:
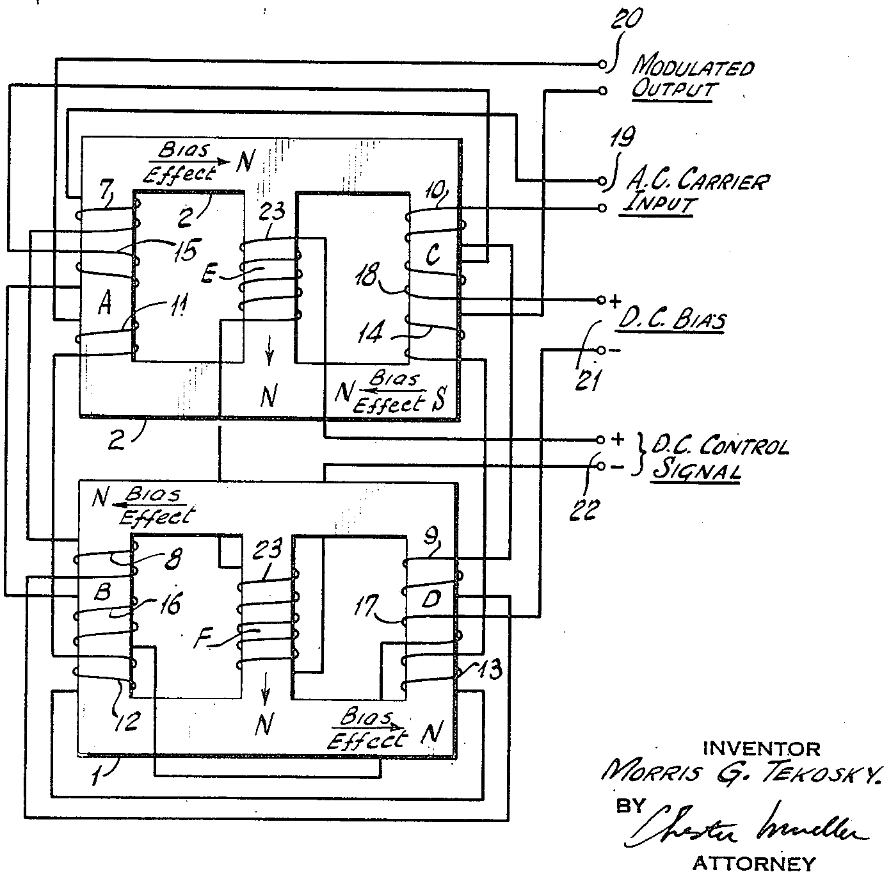
Figure 2 is a circuit diagram showing how the coils of Figure 1 are interconnected to obtain magnetic push-pull phase reversing operation.

There are five coil packs in the assembly as shown in Figure 1, one of the packs being hidden from view. There is only one coil pack surrounding the center legs of the two sets of laminations. A fragmentary view of the two lamination sets 1 and 2 is included in Figure 4 where a winding 23 for the control signal surrounds the center legs of both sets. In Figure 2 there appears to be a duplication of coils 23, one on leg F of the laminations 1 and the other on leg E of the laminations 2. It will be understood, however, that Figure 2 is diagrammatic of the several circuits of a magnetic amplifier and is not intended to represent the physical arrangement of its parts.

Figure 4:
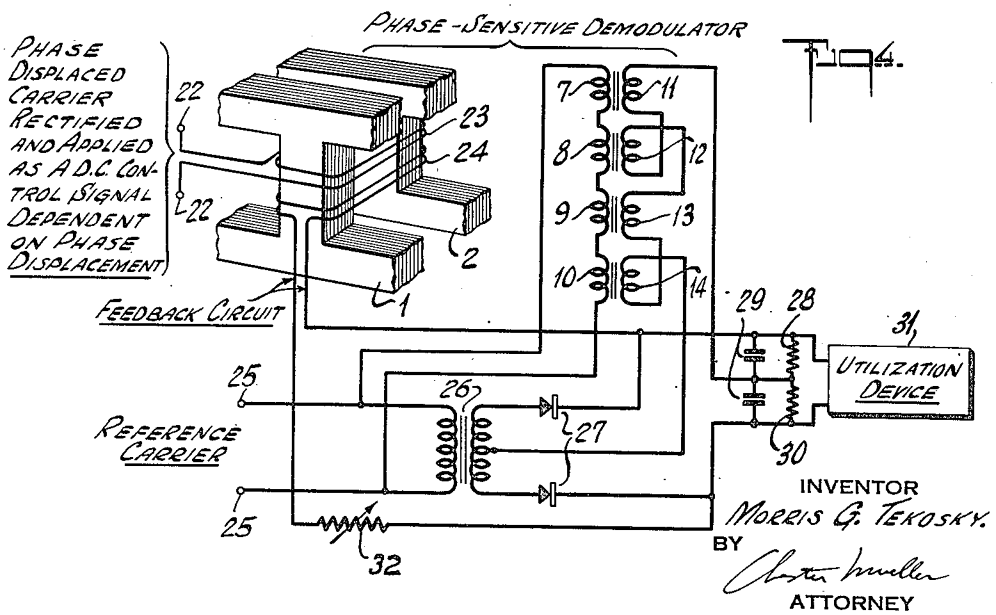
Figure 4 is a diagram showing one of several possible feedback circuit arrangements that may be incorporated into my novel magnetic amplifier.

The center legs of the two core sets when surrounded by a single control winding 23 are substantially free from the magnetizing effects of the A. C. carrier input windings on the outer legs, as will presently be explained. When a feedback circuit is needed this can be added as a feedback coil on the center legs, as shown in Figure 4, coil 24.

Terminal plates 3 may be used to support terminal clips 4 for the several leads to the windings. The plates 3 may be held in place in assembly with the core laminations by means of screws 6 or the equivalent. A base 5 may be formed with up-standing lugs (not shown) through holes in which the lower screw 6 may extend for securing the core and coil assembly in convenient mounting position. Suitable spacing means are inserted between the two terminal plates 3, also between the inside lamination of core member 1 and that of core member 2, so as to enable all of the laminations of these core members to be firmly clamped together by means of the screws 6 and thus to avoid vibration noises. The structural details as described in this paragraph need not necessarily be adhered to exactly, but are given merely by way of example.

Referring now to Figure 2, I show how three windings are included in each of the coil packs surrounding the outer legs of the core members. Core member 1 has legs B and D, while core member 2 has legs A and C. An A. C. carrier input circuit connected to terminals 19 includes series-connected coils 7, 8, 9 and 10. The modulated output circuit which has terminals 20 extends through the series-connected coils 11, 12, 13 and 14. A direct current bias circuit connected serially through coils 18, 15, 16 and 17 is fed from a suitable external source through terminals 21. The D. C. control signal is applied at terminals 22 and extends through the single coil 23 which surrounds the center legs of both core members 1 and 2. The physical arrangement of coil 23, as explained above, is best shown in Figure 4, although there a feedback winding 24 is added, which is not always required.

The push-pull mode of operation of my improved magnetic amplifier is quite dependent upon a proper interconnection between a terminal of each winding and a terminal of another winding with which it is serially connected. In other words, the matter of left-hand and right-hand courses, or clockwise and counter-clockwise directions of the winding convolutions is of vital importance. The instantaneous directions of current flow through the several windings may be compared by noting the directions of a series path of any circuit around the four outer legs of the lamination sets. The resultant magnetic effects will now be discussed:

Assume first that the number of turns of each of the windings 7, 8, 9 and 10 is the same and is equal to that of each of the windings 15, 16, 17 and 18. Assume, also, that the voltage of the D. C. bias is equal to the R. M. S. voltage of the A. C. carrier input power applied at terminals 19. These assumptions need not necessarily hold in practice, but are stated merely to explain the operation under relatively simple conditions. Also consider the condition in which no current flows through the control signal circuit that is connected to terminals 22. Then at a given instant when the magnetizing forces of coils 7 and 15 on leg A are opposed to one another, so also will the magnetizing forces of coils 10 and 18 on leg C be in opposition. This condition exists only during half-cycles of like polarity in the carrier input circuit. When the polarity is reversed, the magnetizing effect of the carrier will be in aiding relation to that of the bias coils 15 and 18. The resulting magnetization of the core member 2 will have the polarity indicated by the arrows in the horizontal sections of this member. While the legs A and C will be strongly magnetized the center leg E will be substantially de-magnetized.

At that "given instant" as mentioned in the preceding paragraph the magnetizing forces in coils 8 and 16 on leg B will be in aiding relation, and so, also, will they be in aiding relation in coils 9 and 17. When the polarity of the carrier input circuit is reversed, as stated in the preceding paragraph, the magnetization of legs B and D will be minimized.

It will be apparent from the two preceding paragraphs that in the absence of a control signal the cyclic magnetizations of legs A and C will be 180° out of phase with those of legs B and D. Furthermore, at no part of the cycle of the carrier input current will there be any appreciable magnetization of the center legs. Hence the fundamental frequency of the carrier is not reflected back into the control circuit, this being a decidedly advantageous feature of the invention under practical operating conditions. It eliminates the need for chokes in the control circuit, and thus enables the ohmic value of the control circuit to be matched to its signal source or to be minimized whenever it is found desirable to do so.

Considering now the relationships between the directions of current flow through each of the input circuit windings 7, 8, 9 and 10, as against the output circuit windings 11, 12, 13 and 14 which share corresponding core legs in common, and continuing to assume the absence of a control signal, the following conditions will be observed:

(1) The inductive effect of coil 7 upon coil 11 will be neutralized by the opposing inductive effect of coil 10 upon coil 14 at any given instant.

(2) The inductive effect of coil 8 upon coil 12 will be neutralized by the opposing inductive effect of coil 9 upon coil 13 at any given instant.

(3) The effect of the bias circuit magnetization is such as to synchronize the maxima of induction in legs A and D, and those maxima are in phase opposition to the maxima of induction in legs B and C. Therefore, a balanced state of neutralization of the inductive effects is present throughout each cycle of the carrier input so long as the control signal remains absent.

It is now in order to discuss the application of a control signal for energizing the center-leg coil 23:

The control signal may be keyed on and off and may be of constant amplitude when it is on. For many applications, however, it may be necessary to vary the amplitude and polarity of the control signal so as to cause the delivery of a modulated phase reversing output of variable amplitude. In still other applications, as will be explained by reference to Figure 4, the control signal may be derived from a phase displaced carrier wave, a rectified component of which, when combined with that of a reference carrier wave, will produce variable degrees of core saturation dependent upon the angle and/or amplitude of phase difference between the two waves. My magnetic amplifier is well suited for operation under any of these modes of control.

The magnetic flux produced in the center leg of core member 1 has the same direction of its polarity as in core member 2. In the remaining portions of these core members, however, the flux produced by the control signal produces simultaneously both aiding and opposing relationships with regard to the synchronizing bias effect. Thus, in legs A and D an aiding relationship exists, while in legs B and C an opposing relationship exists.

A characteristic curve of flux density variations in a magnetic core in relation to variations of the ampere turns in the magnetizing coil has a steep nonlinear slope as it ascends from a base representing de-magnetization of the core, and the curve levels off as the magnetization approaches saturation. This curve is well known.

The synchronizing force of the bias gives me a reference value of magnetization in the outer legs of the amplifier. This reference value of magnetization enables me to operate my amplifier in response to the application of a D. C. control signal in such manner that in different legs of the core members there are simultaneous swings of flux density toward and away from saturation. These opposing swings are unequal because they occur above and below the knee of the curve. The natural effects to be derived from the application of a control signal to the coil 23 stem from what has just been stated in regard to the characteristic curve of flux density, and this important aspect of my invention will now be explained in more detail:

Assuming that a D. C. control signal having the polarity indicated by the + and − signs at the terminals 22 is used to energize coil 23, then the center legs F and E of the two core elements 1 and 2 respectively will both be magnetized with the north pole facing downward. This magnetic polarity is in aiding relation to the synchronizing bias effect that is produced in legs A and D, and is in opposing relation to the bias effect that is produced in legs B and C. So the flux density resultant from the combined effects of the control signal and the D. C. bias rises above the knee of the characteristic curve in legs A and D and at the same time it falls to a greater extent below that knee in legs B and C. Therefore, in legs B and C the amplification factor rises with an increase of signal intensity, whereas in legs A and D the approach of the flux density toward saturation causes the amplification factor to be diminished. The net change is positive.

If it is desired to reverse the phase of the modulated output with respect to the phase of the carrier input, then by inserting a polarity reversing switch (not shown) in the circuit of the D. C. control signal and causing the current thereof to flow in the opposite direction it will be apparent that the aiding relation between the bias effect and the control signal will be shifted from one to the other of the outer legs in each of the core members, 1 and 2. This shift causes the amplification factor to rise in legs A and D with an increase in signal intensity, and to fall in legs B and C. With such a shift of the net positive control to different legs of the core members it will be observed that the phase of the modulated output is reversed.

Some of the advantages of my improved magnetic amplifier will now be pointed out as compared with magnetic amplifiers of the prior art.

The sensitivity of my magnetic amplifier depends upon quite different factors with respect to those that obtain in the prior art devices. The push-pull principle of operation of my amplifier provides greater freedom from the adverse effects of air-gaps in the magnetic path of the core. High sensitivity coupled with linearity of the response curve is readily obtained in my magnetic amplifiers despite the presence of small air gaps. This is not true of the prior art magnetic amplifiers.

The push-pull mode of operation of my amplifiers gives great stability of control because the working range of variation of the flux density in my amplifiers lies both above and below the knee of the B—H curve, whereas, in prior art magnetic amplifiers the sensitivity depended upon operation almost entirely above the knee of that curve and with increasing instability as the flux density approached saturation. While self-saturation was needed in the prior art devices, that is something to be avoided in my improved magnetic amplifier.

The heretofore known types of magnetic amplifiers have, in many cases, required the use of auxiliary rectifiers, whereas my use of a biasing circuit has largely eliminated the need for rectifiers.

In the center legs E and F of my magnetic amplifier the magnetizing effects of the carrier wave are completely neutralized, so far as the fundamental frequency is concerned. Therefore no chokes are required in the control circuit. This means improved sensitivity of my novel magnetic amplifier. Furthermore, I am enabled to employ control circuits of extremely low impedance wherever desired.

The transformer structure of my magnetic amplifier is one wherein any desired step-up or step-down ratio may be provided. Hence it becomes unnecessary to employ external transformers between the output from the magnetic amplifier and the useful load.

Figure 3:
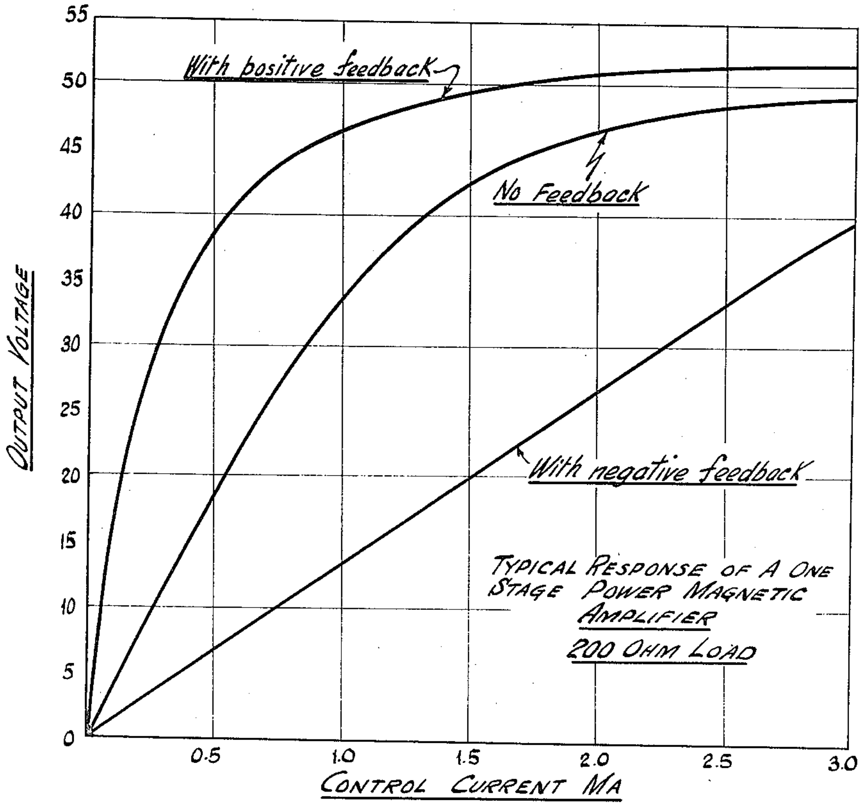
Figure 3 is a graphic chart showing typical response curves of a one-stage power magnetic amplifier which exemplifies my invention.

In Figure 3 I have shown three typical response curves of a one-stage power magnetic amplifier which embodies the improvements of my invention. These curves are here given for the purpose of comparison of the amplification factors involved when no feedback is provided and when the feedback is, in one case positive, and in the other case negative. The curve labeled "no feedback" is typical of the operating characteristics of the amplifier shown and described above in connection with Figure 2. When positive feedback is introduced, the knee of the curve becomes more pronounced. When negative feedback is introduced, then the curve approaches linearity.

One example of a feedback circuit arrangement will now be described, reference being made to Figure 4.

The circuit therein shown represents a phase-sensitive demodulator. A typical use for it would be for controlling and driving a reversible motor, or other electrical device which is required to be reversibly controlled in response to polarity reversals of direct current. Figure 4, however, may be considered to be the first stage of a cascaded magnetic amplifier where a following stage (without feedback) may take the place of the utilization device 31.

The transformer windings 11 to 14 inclusive are secondaries mounted on core legs of two laminated sets 1 and 2, the same as described above in reference to Figure 2; that is, they are mounted on legs A, B, C and D, respectively.

The D. C. bias windings as shown in Figure 2 are quite essential to the circuit arrangement of Figure 4, but, for the sake of simplicity of the drawing, Figure 2 is relied upon to show the inter-relationships of the several coils.

The control winding 23 (Figure 4) has terminals 22 against which I have applied the legend "Phase-displaced carrier, rectified and applied as a D. C. control signal dependent on phase displacement." The assumption is here made that the magnetic amplifier under discussion has the function of delivering useful power to a reversible D. C. motor, say for correcting an error of orientation of some rotatable element. The error may, for example, be detected by the use of two inter-connected selsyn motors, one of which has its rotor mechanically connected to a given control member, while the other selsyn has its rotor coupled or geared to the aforementioned rotatable element the orientation of which is to be phase corrected. The selsyns both have 3-phase field windings and the armature windings of the two selsyns are inter-connected. These details of selsyn motor installations are well known in the art and it does not, therefore, appear to be necessary to show them in this application. It will be apparent, however, that when a phase difference is developed between the orientations of the armatures in the two selsyns, then a single-phase current is induced in these two inter-connected armatures the amplitude of which varies in proportion to the angular displacement of one armature with respect to the other.

Now when that single-phase current is rectified it becomes useful as a control signal and as input potential to be applied to the winding 23 about the center legs F and E of the core sets 1 and 2 respectively, as shown in Figure 4. The polarity of the control signal is reversed if said single-phase current as generated in the selsyn armature circuit drifts from a "leading" to a "lagging" phase departure with reference to a given carrier wave that has a fixed reference phase. Since this is true, it will be clear that the output from my magnetic amplifier will not only vary in amplitude according to the amplitude of the control signal, but such output when rectified will flow in one or the other of two directions according to whether the original phase error was of "leading" or "lagging" sense. This aspect of the invention will now be further explained:

The aforementioned reference carrier wave is used to supply the amplifying power and is applied to terminals 25. The series circuit through the primary windings 7, 8, 9 and 10 is connected across the terminals 25, and in parallel therewith I also connect the primary winding of a transformer 26. The secondary of this transformer has a mid-tap connected to one end of the series circuit through secondary windings 14, 13, 12 and 11, which are the same as those shown in Figure 2, being in the output circuit of the demodulator. The other end of this series circuit is preferably connected to a junction point between two resistors 28 and 30, the latter having outer-end terminals connected across an input circuit for a utilization device 31, and also having connections to rectifiers 27. These rectifiers are in circuit with the secondary of transformer 26 and serve to produce a current flow through the two resistors 28 and 30 unilaterally toward the junction point between them and thence through the magnetic amplifier output windings 11, 12, 13 and 14 and to the center tap on the secondary of transformer 26. This current is preferably filtered by means of capacitors 29 which are connected respectively in shunt with the resistors 28 and 30.

The feedback circuit shown in Figure 4 is connected in shunt with the utilization device 31 and surrounds the center legs E and F of the core members 2 and 1 respectively in the magnetic amplifier unit, being in the form of a winding 24. The phase-sensitive demodulator shown in Figure 4 operates as follows:

Assume first that the armatures of the two selsyns as aforementioned are in phase and that, therefore, the currents induced in them by their respective 3-phase fields are mutually opposed and cancel out. Now the control signal that would otherwise be fed to terminals 22 is absent because of the phase agreement. Although there may be some flow of alternating current through the winding 24 as derived from un-rectified output components of the secondary on transformer 26, that current may be regarded as of negligible amount and has no appreciable effect on the operation of the feedback circuit through the winding 24.

The conditions as assumed in the preceding paragraph are such that the rectified output from the secondary winding of transformer 26 flows equally to the resistors 28 and 30 and through them to their junction point, so that there is no difference of potential between the two input leads to the utilization device 31. This condition holds so long as the action of the magnetic amplifier, corresponding to what was described in reference to Figure 2, is such that all currents induced in the output windings 11, 12, 13, and 14 by their coupled carrier input windings 7, 8, 9 and 10 continue to be mutually opposing and neutralized. It will be remembered that this condition was shown to prevail in the absence of a control signal.

Now in contrast with the no-signal conditions as set forth above, the action of the magnetic amplifier alone and without considering the flow of direct current from the secondary of transformer 26 through the windings 11, 12, 13 and 14 will be exactly the same as was described above in reference to Figure 2. That is to say, the output will be of variable amplitude dependent upon the amplitude of the control signal. Also the polarity of the control signal will determine whether the output is in phase agreement or phase opposition to the reference carrier.

In the presence of a control signal the unbalance of gain factors in different legs of the magnetic core members was shown to cause the currents induced in windings 11 and 13 to be either greater or less in amplitude than those induced in windings 12 and 14. The predominance of the gain factors one way or the other gives rise to the determination of which of the half-cycles of output current from the magnetic amplifier will be in aiding relation to the rectified current delivered by the secondary of the transformer 26. Accordingly, the effect of the magnetic amplifier action is to shift the polarity of the junction point between resistors 28 and 30 from a neutral value to either a positive or a negative value. So the potential drop through these resistors will become unequal and a net difference of D. C. potential will be developed across the input leads to the utilization device 31, and also those leads to the feedback winding 24. Thus it results that the utilization device is made subject to control by a reversible D. C. control potential, and this is true whether or not a feedback circuit is included in the system.

The feedback winding is operative solely by virtue of the component of direct current that is derived as explained in the preceding paragraph. The feedback effect can be made either positive or negative according to the manner in which the terminals of the winding 24 are connected to the upper and lower ones of the rectifiers 27. The amplitude of the feedback current can be controlled by adjustment of a potentiometer 32 in its circuit.

Since the input leads for the utilization device 31 are conductors of direct current of reversible polarity, it is apparent that, if it were desirable to do so, a second stage of a magnetic amplifier might be inserted between the terminals of the resistors 28—30 and the input leads to the utilization device 31. This second stage, presumably would not need a feedback circuit, but in other respects it would preferably be the same as shown in Figure 4.

My invention may readily be modified in various ways without the exercise of invention over what has been described and shown in the accompanying drawings as an illustrative embodiment. This will be well understood by those skilled in the art. The claims are, therefore, intended to cover such changes or modifications as come within the spirit of the invention, rather than that the invention should be limited to the precise details of structure, of circuitry, or of elements in combination as herein set forth. For example this invention may be embodied in a set of four identical toroidal transformers and the same results will be secured as with the specific structures herein described.

I claim:

1. A magnetic modulator comprising a composite transformer arrangement having four identical transformers each mounting four identical coils; a coil of each transformer in circuit with a common source of carrier waves and interconnected with their polarity in series aiding relation; another coil of each transformer being included in a common output circuit with adjacent coils connected in polarity opposition; still another coil of each transformer in circuit with a common direct current source one pair of coils being connected with their polarity in series aiding relation but in opposition to the polarity of the second pair of coils which are connected with their polarity in series aiding relation; the remaining coils of each transformer alternately connected in polarity opposition.

2. A magnetic modulator comprising a composite transformer arrangement having four identical transformers, each having a primary, secondary, bias and control winding; the primary winding of each transformer in circuit with a common source of carrier waves and interconnected with their polarity in series aiding relation; the secondary winding of each transformer being included in a common output circuit with adjacent windings connected in polarity opposition; the biasing winding of each transformer in circuit with a common direct current source, one pair of windings being connected with their polarity in series aiding relation but in opposition to the polarity of the second pair of windings which are connected with their polarity in series aiding relation; and the control windings of each transformer being alternately connected in polarity opposition.

3. A magnetic modulator comprising a composite transformer arrangement having two sets of 3-leg core laminations; a single control winding surrounding the center legs of both sets; a primary winding on each outer leg of each set connected to a common source of carrier waves and interconnected with their polarity in series aiding relation; a secondary winding on each outer leg of each set being included in a common output circuit and interconnected with each other so that the polarity of the windings on the outer legs of one set is in opposition to each other and to the polarity of the windings on the outer legs of the other set which are also in opposition to each other; and a biasing winding on each outer leg of each set in circuit with a common direct current source and interconnected so that the polarity of the series aiding windings on the outer legs of one set is in opposition to the polarity of the series aiding windings on the outer legs of the other set.

4. A magnetic modulator comprising a composite transformer arrangement having two sets of 3-leg core laminations; a single control winding surrounding the center legs of both sets; a primary winding on each outer leg of each set connected to a common source of carrier waves and interconnected with their polarity in series aiding relation; a secondary winding on each outer leg of each set being included in a common output circuit and interconnected with each other so that the polarity of the windings on the outer legs of one set is in opposition to each other and to the polarity of the windings on the outer legs of the other set which are also in opposition to each other; and a biasing winding on each outer leg of each set in circuit with a common direct current source and interconnected so that the polarity of the windings on the outer legs of one set is in opposition to the polarity of the windings on the outer legs of the other set, and in opposition to each other.

5. A magnetic modulator comprising a composite transformer arrangement having two sets of 3-leg core laminations; a single control winding surrounding the center legs of both sets; an identical primary winding on each outer leg of each set connected to a common source of carrier waves and interconnected with their polarity in series aiding relation; an identical secondary winding on each outer leg of each set being included in a common output circuit and interconnected with each other so that the polarity of the windings on the outer legs of one set is in opposition to the polarity of the windings on the outer legs of the other set; and a biasing winding on each outer leg of each set of the same number of turns as the primary winding, in circuit with a common direct current source and interconnected so that the polarity of the windings on the outer legs of one set are in series aiding relation and are in opposition to the polarity of the windings which are in series aiding relation on the outer legs of the other set.

6. A magnetic modulator comprising a composite transformer arrangement having two sets of 3-leg core laminations; a single control winding surrounding the center legs of both sets; an identical primary winding on each outer leg of each set connected to a common source of carrier waves and interconnected with their polarity in series aiding relation; an identical secondary winding on each outer leg of each set being included in a common output circuit and interconnected with each other so that the polarity of the windings on the outer legs of one set is in opposition to the polarity of the windings on the outer legs of the other set; and a biasing winding on each outer leg of each set of the same number of turns as the primary winding, in circuit with a common direct current source and interconnected so that the polarity of the windings on the outer legs of one set is in opposition to the polarity of the windings on the outer legs of the other set, and in opposition to each other.

References Cited in the file of this patent

UNITED STATES PATENTS

| | | |
|---|---|---|
| 2,164,383 | Burton | July 4, 1939 |
| 2,400,559 | Majlinger et al. | May 21, 1946 |
| 2,464,639 | FitzGerald | Mar. 15, 1949 |
| 2,481,644 | Callaway | Sept. 13, 1949 |
| 2,552,952 | Gachet et al. | May 15, 1951 |
| 2,571,708 | Graves | Oct. 16, 1951 |
| 2,594,022 | Horton | Apr. 22, 1952 |
| 2,608,676 | MacCallum et al. | Aug. 26, 1952 |
| 2,678,419 | Bennett | May 11, 1954 |

OTHER REFERENCES

AIEE Publication Magnetic Amplifiers, by Geyger, December 1949, pp. 1–17, Figs. 1 to 42, on 7 sheets (see Fig. 36).